(12) United States Patent
Park et al.

(10) Patent No.: US 6,521,941 B2
(45) Date of Patent: Feb. 18, 2003

(54) NON-VOLATILE MEMORY DEVICE AND FABRICATION METHOD THEREOF

(75) Inventors: Kyu-Charn Park, Kyunggi-do (KR); Jung-Dal Choi, Kyunggi-do (KR); Yong-Sik Yim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/861,213

(22) Filed: May 17, 2001

(65) Prior Publication Data

US 2002/0050609 A1 May 2, 2002

(30) Foreign Application Priority Data

Oct. 27, 2000 (KR) ......................................... 2000-63396

(51) Int. Cl.[7] ............................................. H01L 29/788
(52) U.S. Cl. ...................................... 257/315; 257/314
(58) Field of Search ................................. 257/296, 300, 257/306, 314, 344, 368, 315, 316, 317, 318, 319, 320, 321, 322, 323

(56) References Cited

U.S. PATENT DOCUMENTS 4,972,378 A * 11/1990 Kitagawa et al.
5,541,877 A * 7/1996 Shirai
5,545,907 A * 8/1996 Maari
6,284,637 B1 * 9/2001 Chhagan et al.

\* cited by examiner

Primary Examiner—Nathan J. Flynn
Assistant Examiner—Kevin Quinto
(74) Attorney, Agent, or Firm—Marger Johnson & McCollom, P.C.

(57) ABSTRACT

A non-volatile memory device and fabrication methods thereof are provided. A first inter-gate insulating layer is formed to intervene between control gate electrodes and floating gate electrodes in a cell array area. A second inter-gate insulating layer is formed to intervene between a gate electrode and a dummy gate electrode in a peripheral circuit area. The second inter-gate insulating layer has a thickness greater than a thickness of the first inter-gate insulating layer on a top surface of the floating gate electrodes. By reducing the difference between the thickness of the first inter-gate insulating layer on sidewalls of floating gate patterns and the thickness of the second inter-gate insulating layer on a gate electrode pattern, in accordance with the invention, any etching damage to the substrate in the peripheral circuit area can be considerably reduced or prevented during the fabrication process.

18 Claims, 10 Drawing Sheets

NON-VOLATILE MEMORY DEVICE AND FABRICATION METHOD THEREOF

This application relies for priority upon Korean Patent Application No. 2000-63396, filed on Oct. 27, 2000, the contents of which are herein incorporated by reference in their entirety.

FIELD OF THE INVENTION

The present invention relates to semiconductor devices and fabrication methods thereof and, more particularly, to non-volatile memory devices and to fabrication methods thereof.

BACKGROUND OF THE INVENTION

A non-volatile memory device is an advanced type of memory device that retains information stored in its memory cells even when no power is supplied. Nowadays, the non-volatile memory device is widely used in various kinds of electronics product like as a cellular phone, a memory card and so on.

The non-volatile memory device generally comprises a cell array area and a peripheral circuit area. The cell array area is comprises a plurality of memory cells organized in a two-dimensional matrix. That is to say, the cells are organized in rows and columns. Unit cells are located at the respective intersections formed by a plurality of word lines and a plurality of bit lines in the matrix. The peripheral circuit area is generally formed to surround the cell array area. In the peripheral circuit area, there is circuitry for performing a programming operation, a reading operation, an erasure operation and so on. A stacked gate cell is used as a unit cell of a number of non-volatile memory devices with an advantage of its small cell size (surface area). The stacked gate cell has a floating gate electrode and a control gate electrode. Typically, the control gate electrode is stacked on the floating gate electrode.

FIGS. 1 to 4 are cross-sectional views illustrating a process for forming a non-volatile memory device according to the prior art. A cell array area and a peripheral circuit area are denoted by bracketed regions "a" and "b" respectively. For a better understanding of problems in the prior art, the cross-sectional views in the cell array area are taken along a line between and parallel to the control gate electrodes of the cell array. The control gate electrodes act as the word lines during operation of the device. The cross-sectional views in the peripheral circuit area are taken across a gate electrode of a transistor.

Referring to FIG. 1, an isolation region 3 is formed in a semiconductor substrate 1, thereby defining active regions in the substrate 1. The isolation region 3 surrounds the active regions. A tunnel oxide layer 5 is formed on the surface of the active regions with a thickness of 100 Å or less. A first conductive layer 7 is formed on a surface of the resultant structure. The first conductive layer is patterned to form floating gate patterns 7a in the cell array area, and to form a gate electrode pattern 7b in the peripheral circuit area. It is preferable that sidewalls of the floating gate patterns 7a have inclinations with complementary positive and negative slopes to the substrate as shown in the figure. These sidewall inclinations are helpful to prevent voids from forming between the floating gate patterns 7a during subsequent process steps.

An inter-gate insulating layer 9 is formed on a surface of the resultant structure having the floating gate patterns 7a and the gate electrode pattern 7b. The inter-gate insulating layer 9 has a thickness T1 along a sidewall of the floating gate patterns 7a and a thickness T2 on a top surface of the gate electrode pattern 7b. Thickness T1 is measured vertically to the surface plane of the substrate 1. Thickness T1 is much greater than thickness T2. This is due to the inclination of the sidewall of the floating gate patterns 7a.

Referring to FIG. 2, a second conductive layer 11 is formed on a surface of the resultant structure. Photoresist patterns 13 are formed on the second conductive layer 11. The photoresist patterns 13 are for patterning the control gate electrodes of the cell array (though not shown) and the gate electrode of a transistor of the peripheral area. Because the cross-sectional views in the cell array area are taken along the line between and parallel to the control gate electrodes of the cell array, as described above, there is no photoresist pattern shown in the cell array area of the figure.

Referring to FIG. 3, the second conductive layer 11 and the inter-gate insulating layer 9 are etched continuously using the photoresist patterns 13 as etch masks by anisotropic dry etching to form the control gate electrodes (though not shown) and a dummy gate electrode 11d. There may result over-etching in the gate electrode pattern 7b, causing a considerably recessed gate electrode pattern 7b'. An etch time to completely remove the inter-gate insulating layer 9 in the cell array area is greater than an etch time to completely remove the inter-gate insulating layer 9 in the peripheral circuit area. This is due to a unique anisotropic characteristic of the etching and the thickness difference between thickness T1 and thickness T2. Moreover, an etch rate in the relatively dense cell array area is greater than an etch rate in the relatively sparse peripheral circuit area. This etch rate difference is known as a loading effect in dry etching technique. For the reasons described above, there may be some recession D shown in FIG. 3. In other words, the thickness of the floating gate patterns 7a may be greater than a thickness of the recessed gate electrode pattern 7b' just after forming the control gate electrodes and the dummy gate electrode 11d.

Referring to FIG. 4, the floating gate patterns 7a and the recessed gate electrode pattern 7b' are etched using the photoresist patterns 13 as etch masks to form floating gate electrodes (though not shown) and gate electrode 7g. As shown in the figure, there may be some crystalline defect A after the forming the floating gate electrodes (though not shown) and the gate electrode 7g. The crystalline defect results from etch damage on the substrate 1. This is because of the thickness difference between the floating gate patterns 7a and the recessed gate electrode pattern 7b. Such a crystalline defect A on the silicon substrate is known to induce undesirable leakage current in a semiconductor device.

SUMMARY OF THE INVENTION

It is an object of the present invention to provide a non-volatile memory device having no crystalline defect on a semiconductor substrate.

Another object of the present invention is to provide a method for forming a non-volatile memory device, which can prevent over-etching in forming a gate electrode in a peripheral circuit area and a floating gate electrode in a cell array area.

According to one aspect of the present invention, a non-volatile memory device is provided. The non-volatile memory device comprises first and second active regions formed in a semiconductor substrate and defined by an isolation region. A control gate electrode is disposed across the first active region, and a floating gate electrode intervenes between the control gate electrode and the first active region. A first inter-gate insulating layer intervenes between the control gate electrode and the floating gate electrode. A gate electrode is disposed across the second active region. A dummy gate electrode is disposed on the gate electrode. A second inter-gate insulating layer intervenes between the gate electrode and the dummy gate electrode. The second inter-gate insulating layer is thicker than the first inter-gate insulating layer.

According to another aspect of the present invention, a semiconductor device is provided. The semiconductor device comprises a dense area and a sparse area in a semiconductor substrate. A first active region is formed in the dense area. A second active region is formed in the sparse area. A first conductive layer is formed on the first and the second active regions. A second conductive layer is formed on the first conductive layer. A silicon nitride layer intervenes between the first conductive layer and the second conductive layer, and a composite insulating layer intervenes between the second conductive layer and the silicon nitride layer. A portion of the composite insulating layer on the second active region is thicker than another portion of the composite insulating layer on the first active region.

According to another aspect of the invention, a method of forming a nonvolatile memory device is provided. This method comprises providing a semiconductor substrate having a cell array area and a peripheral circuit area. An isolation region is formed to define a first active region and second active regions in the cell array area and the peripheral circuit area respectively. A tunnel oxide layer is formed on the first and the second active regions. A first conductive layer is formed on the resultant structure having the tunnel oxide layer. The first conductive layer is patterned to form a floating gate pattern on the first active region and a gate electrode pattern on the second active region. First and second inter-gate insulating layers are formed on the floating gate pattern and the gate electrode pattern respectively. The second inter-gate insulating layer is thicker than the first inter-gate insulating layer. A second conductive layer is formed on the first inter-gate insulating layer and the second inter-gate insulating layer.

Accordingly, it is possible to reduce any undesirable difference between the thickness of the first inter-gate insulating layer on a sidewall of the floating gate patterns and the thickness of the first inter-gate insulating layer on the gate electrode pattern. It is also possible to prevent over-etching when forming a gate electrode in a peripheral circuit area and a floating gate electrode in a cell array area.

BRIEF DESCRIPTION OF THE DRAWINGS

Other features of the present invention will be more readily understood from the following detail description of specific embodiments thereof when read in conjunction with the accompanying drawings, in which:

FIGS. 6a to 10a and FIGS. 6b to 10b are cross sectional views illustrating successive process steps for forming a non-volatile memory device according to the present invention. FIGS. 6a to 10a are taken along a line I-I' of FIG. 5, and FIGS. 6b to 10b are taken along a line II-II' of FIG. 5.

DESCRIPTION OF THE PREFERRED EMBODIMENT

The present invention will be described more fully hereinafter with reference to the accompanying drawings.

Figure 1:
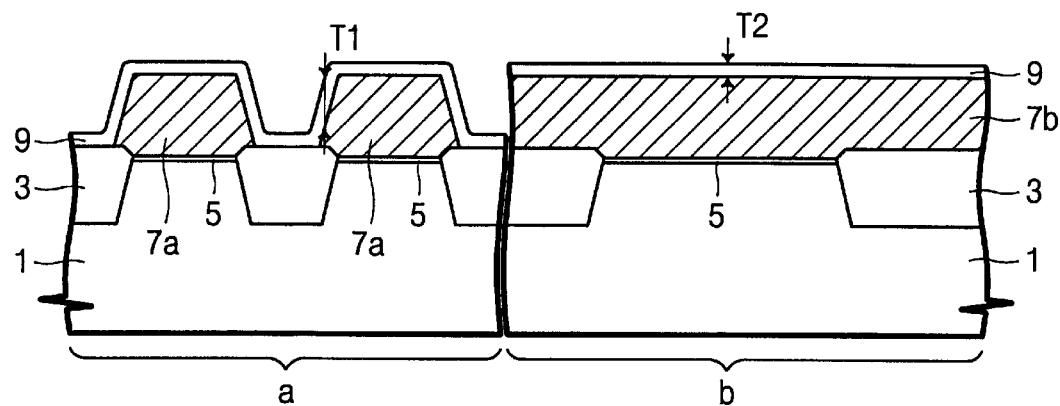
FIGS. 1 to 4 are cross-sectional views illustrating a process for forming a nonvolatile memory device according to a prior art.
Figure 2:
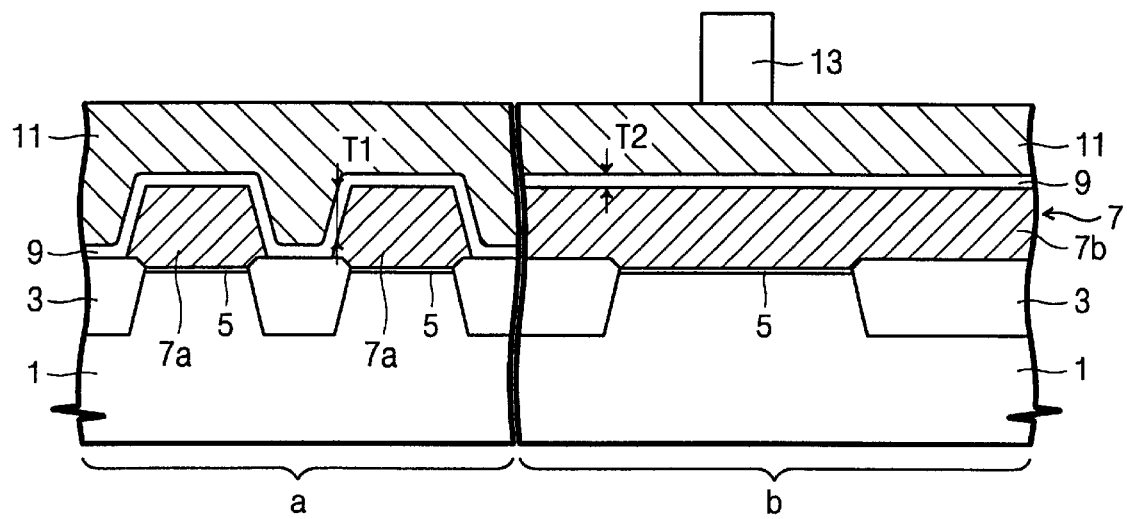
Figure 3:
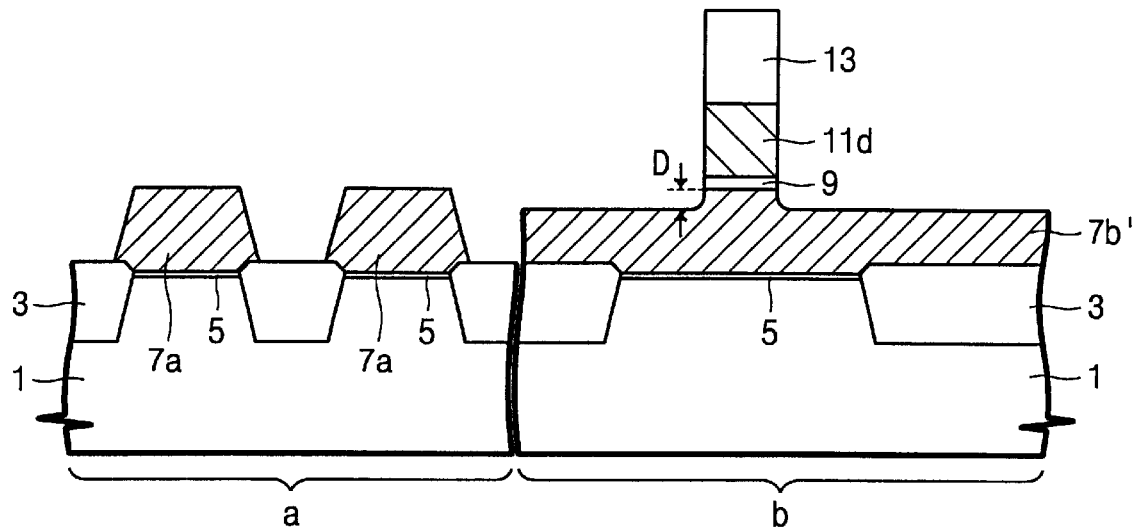
Figure 4:
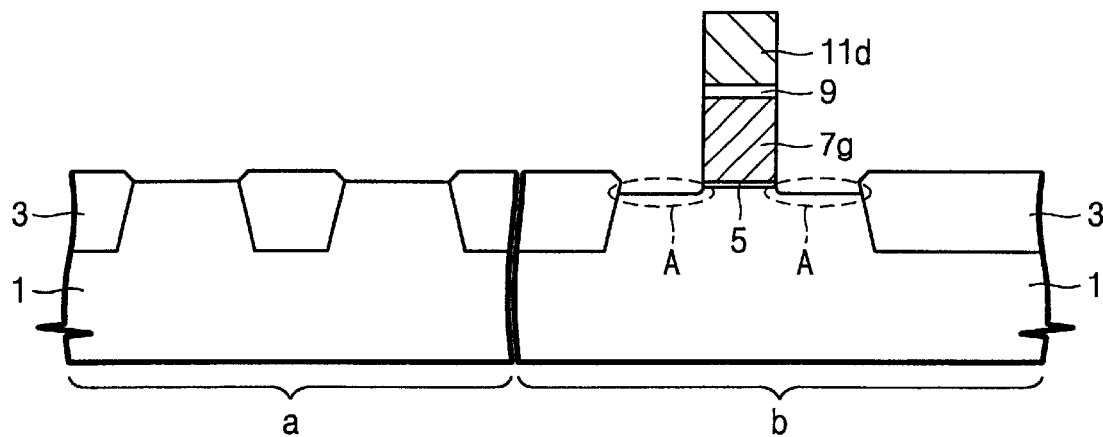
Figure 5:
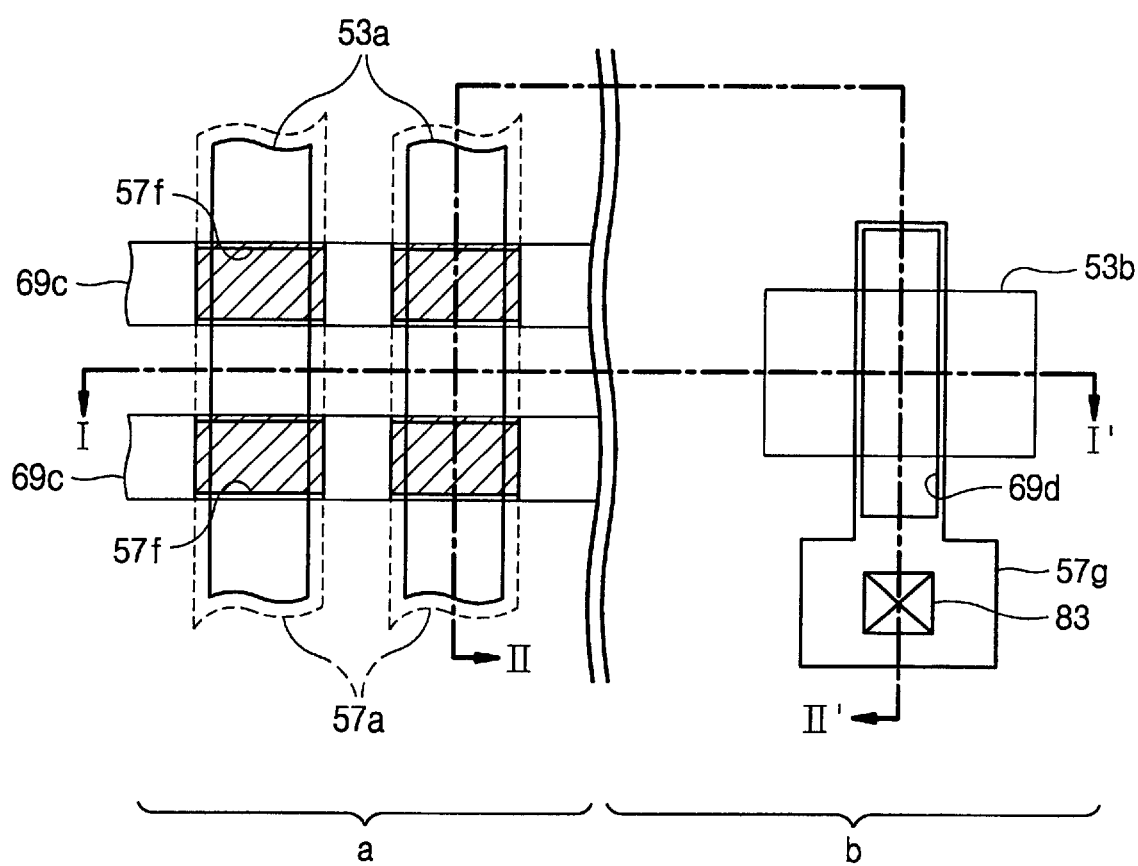
FIG. 5 is a plan view illustrating a non-volatile memory device according to a present invention.

FIG. 5 is a plan view illustrating a non-volatile memory device according to the present invention. Especially, the device is a NAND-type flash memory device, which is one of the non-volatile memory devices, in which the invention is particularly useful. A cell array area and a peripheral circuit area are denoted by bracketed regions "a" and "b" respectively.

Referring to FIG. 5, first active regions 53a are disposed in the cell array area in a semiconductor substrate, and parallel to each other. A second active region 53b is disposed in the peripheral circuit area in the substrate. The first active regions 53a and the second active region 53b are defined by an isolation region (though not shown), which surrounds the active regions.

Control gate electrodes 69c are disposed across the first active regions 53a. The control gate electrodes 69c act as word lines during device operations. Floating gate electrodes 57f are disposed to intervene between the control gate Electrodes 69c and the first active regions 53a. A first inter-gate insulating layer (though not shown) is disposed to intervene between the control gate electrodes 69c and the floating gate electrodes 57f. The floating gate electrodes 57f are formed by etching floating gate patterns 57a using second photoresist patterns as etch masks, as will be described.

A gate electrode 57g is disposed across the second active region 53b. A dummy gate electrode 69d is disposed on the gate electrode 57g. A second inter-gate insulating layer (though not shown) is disposed to intervene between the gate electrode 57g and the dummy gate electrode 69d. The second inter-gate insulating layer on a top surface of the gate electrodes 57g has a thickness greater than a thickness of the first inter-gate insulating layer on a top surface of the floating gate electrodes 57f. More preferably, as shown in FIG. 5, the dummy gate electrode 69d may be disposed only on a portion of the gate electrode 57g. A contact hole 83 may be formed on, to expose, another portion of the gate electrode 57g that is not covered by the dummy gate electrode 69d. The gate electrode 57g and the floating gate electrodes 57f are formed from a first conductive layer. The dummy gate electrode 69d and the control gate electrodes 69c are formed from a second conductive layer.

The first inter-gate insulating layer comprises a lower insulating layer, an intermediate insulating layer and an upper insulating layer, vertically stacked. The second inter-gate insulating layer is formed by vertically stacking the lower insulating layer, the intermediate insulating layer, an additional insulating layer and the upper insulating layer. The lower insulating layer is preferably oxide formed by thermal oxidation or a CVD technique. The intermediate insulating layer is preferably silicon nitride. The additional insulating layer is preferably selected from materials that have relatively fast etch rates for a given etching process (i.e. including etchant, temperature, atmosphere etc.). In contrast, the intermediate insulating layer has a relatively slow etch rate for the given etching process. For example, the additional insulating layer is oxide formed by the CVD technique. The upper insulating layer is preferably oxide formed by any suitable oxidation method e.g. the CVD technique. The additional insulating layer and the upper insulating layer will be referred to herein as a composite insulating layer.

FIGS. 6a to 10a and FIGS. 6b to 10b are cross-sectional views illustrating a process for forming a non-volatile memory device according to the present invention. FIGS. 6a to 10a are taken along a line I-I' of FIG. 5, and FIGS. 6b to 10b are taken along a line II-II' of FIG. 5. A cell array area and a peripheral circuit area are denoted by bracketed regions "a" and "b" respectively.

Figure 6A:
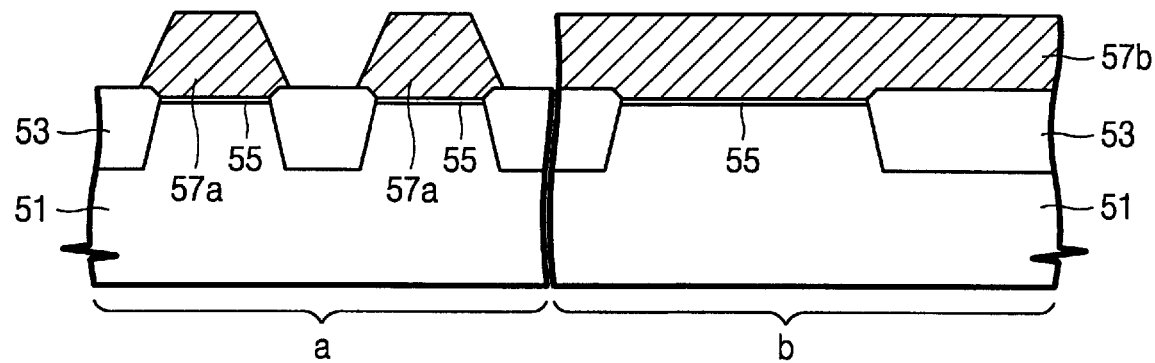
Figure 6B:
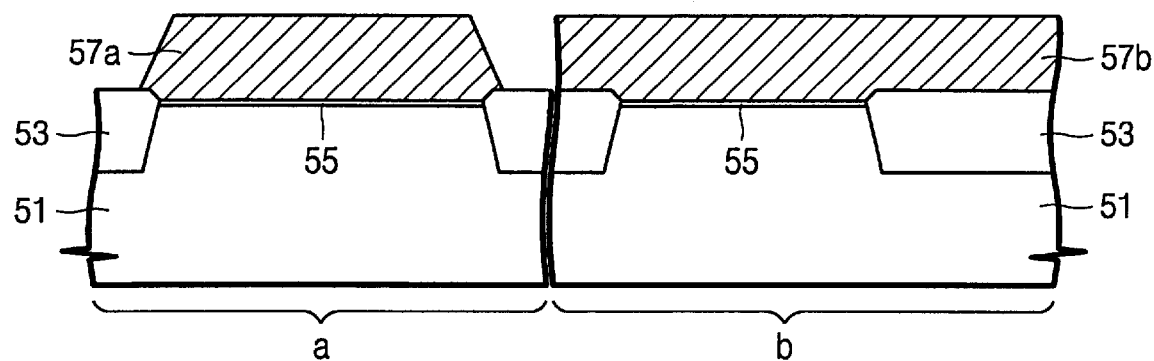

Referring to FIGS. 6a and 6b, an isolation region 53 is formed in a semiconductor substrate to define first active regions (though not shown) in the cell array area and a second active region (though not shown) in the peripheral circuit area. The isolation region 53 may be formed by a LOCOS (local oxidation of silicon) technique or a trench technique. The isolation region 53 surrounds the active regions. A tunnel oxide layer 55 is formed on the surface of the active regions with a thickness of 100 Å or less by thermal oxidation. A first conductive layer is formed on a surface of the resultant structure. For example, the first conductive layer is doped polycrystalline silicon.

The first conductive layer is patterned to form floating gate patterns 57a on the first active regions, and to form a gate electrode pattern 57b on the second active region. The isolation region 53 is thereby exposed in the cell array area. It is preferable that sidewalls of the floating gate patterns 7a have inclinations with complementary positive and negative slopes to the substrate as described in the figure. This is for the reason as described above with respect to the prior art.

Figure 7A:
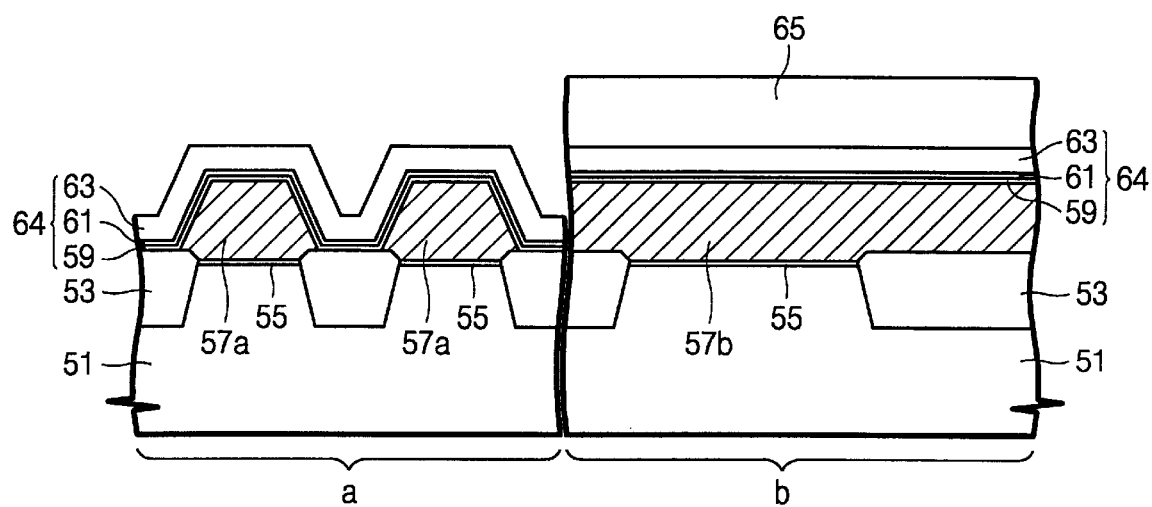
Figure 7B:
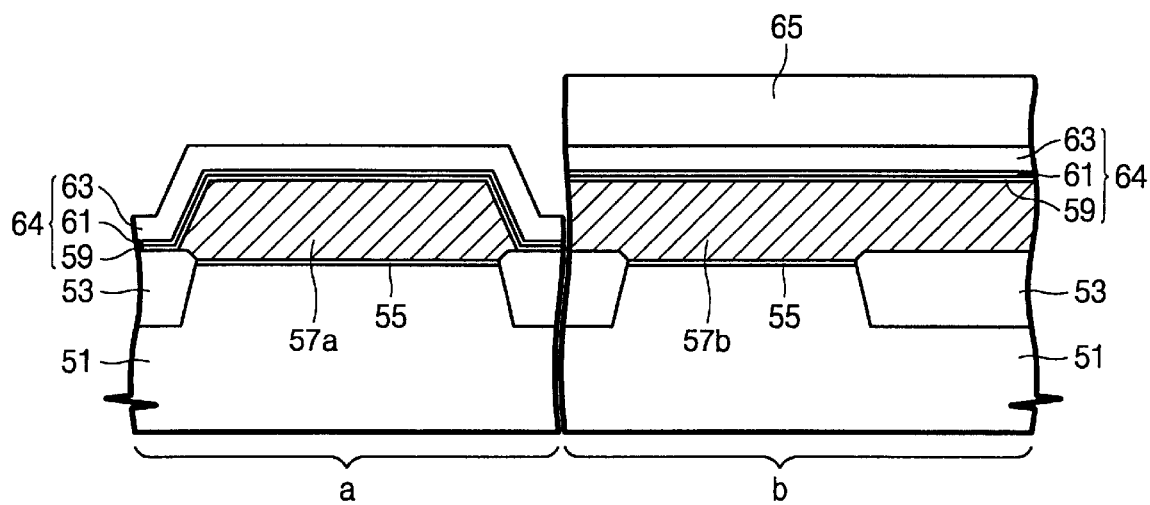

Referring to FIGS. 7a and 7b, a preliminary inter-gate insulating layer 64 is formed on a surface of the resultant structure having the floating gate patterns 57a and the gate electrode pattern 57b. The preliminary inter-gate insulating layer 64 is formed by vertically stacking a lower insulating layer 59, an intermediate insulating layer 61 and an additional insulating layer 63. The lower insulating layer 59 is preferably of oxide formed by the thermal oxidation or CVD technique. The intermediate insulating layer 61 is preferably silicon nitride. The additional insulating layer 63 is preferably selected from materials that have relatively fast etch rates for a given etching process. In contrast, the intermediate insulating layer 61 has a relatively slow etch rate for the given etching process. For example, the additional insulating layer 63 is of oxide formed by the CVD technique. A first photoresist pattern 65 is formed only in the peripheral circuit area to expose the preliminary inter-gate insulating layer 64 in the cell array area.

Figure 8A:
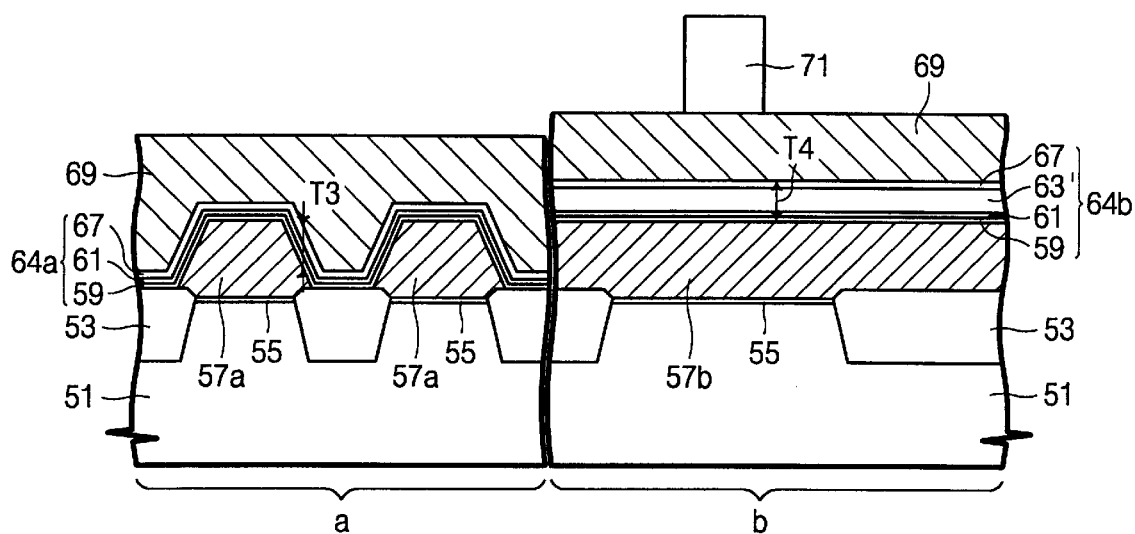
Figure 8B:
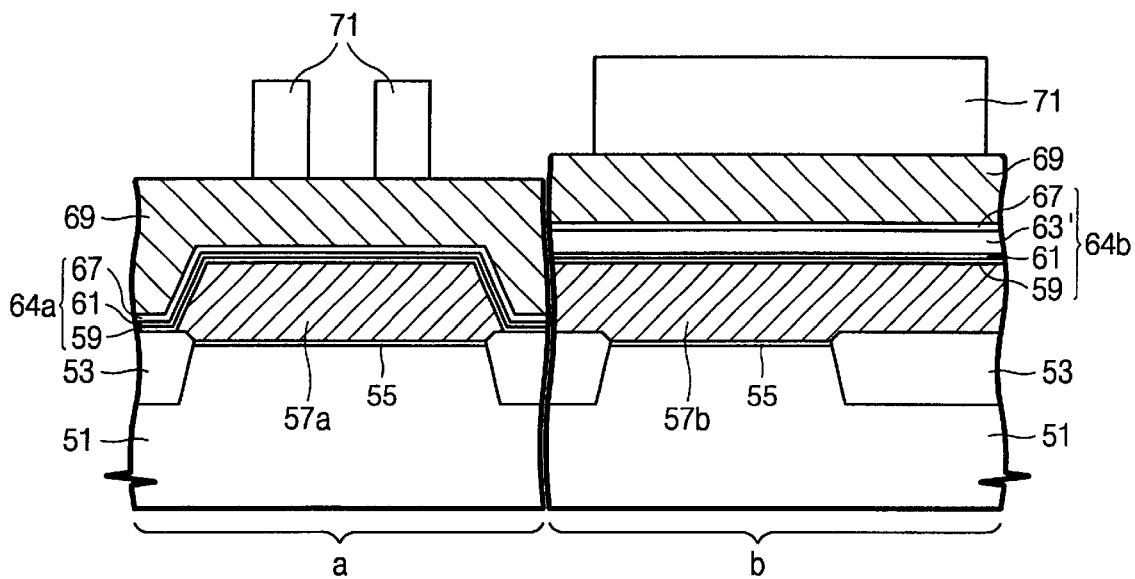

Referring to FIGS. 8a and 8b, the additional insulating layer 63 is etched by the given etching process using the first photoresist pattern 65 as a etch mask. The etching process forms an additional insulating layer pattern 63' and exposes the intermediate insulating layer 61 in the cell array region. The given etching process is preferably a wet etching process. After removal of the first photoresist pattern 65, an upper insulating layer 67 is formed on the resultant structure. For example, the upper insulating layer 67 is oxide formed by any suitable oxidation method e.g. the CVD technique. As a result, a first inter-gate insulating layer 64a and a second inter-gate insulating layer 64b are obtained in the cell array area and the peripheral circuit area respectively.

The first inter-gate insulating layer 64a includes the lower insulating layer 59, the intermediate insulating layer 61 and the upper insulating layer 67. The second inter-gate insulating layer 64b includes the lower insulating layer 59, the intermediate insulating layer 61, the additional insulating layer 63, and the upper insulating layer 67. It may be seen that the second inter-gate insulating layer 64b on a top surface of the gate electrode pattern 57b is thicker than the first inter-gate insulating layer 64a on a top surface of the floating gate patterns 57a. Importantly, a difference between a third thickness T3 of the first inter-gate insulating layer 64a on a typical sidewall of the floating gate patterns 57a and a fourth thickness T4 of the second inter-gate insulating layer 64b on the gate electrode pattern 57b is considerably reduced, compared to the prior art.

A second conductive layer 69 is formed on a surface of the resultant structure. The second conductive layer 69 is preferably doped polycrystalline silicon or polycide including refractory metal silicide. The second photoresist patterns 71 are formed on the second conductive layer 69. The second photoresist patterns 71 are formed across the first active region and the second active region, as best shown in FIG. 8b.

Figure 9A:
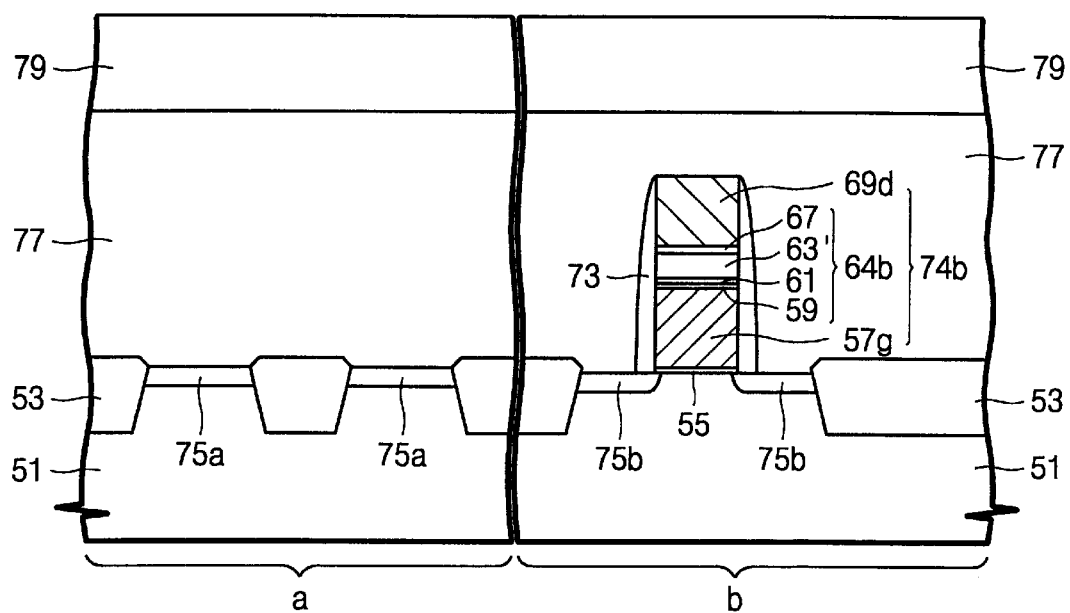
Figure 9B:
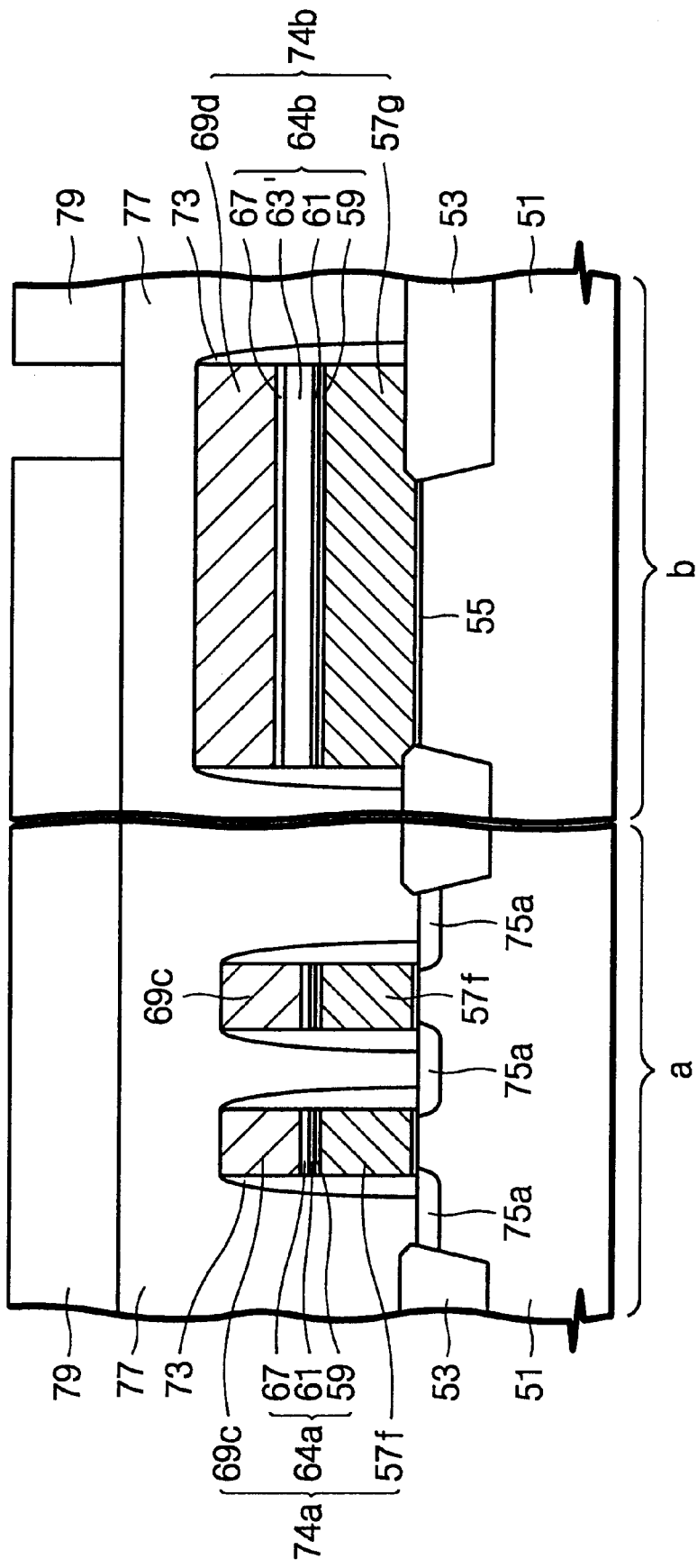

Referring to FIGS. 9a and 9b, the second conductive layer 69, the first and second inter-gate insulating layer 64a, 64b, the floating gate patterns 57a and gate electrode pattern 57b are etched sequentially using the second photoresist patterns 71 as etch masks to form a plurality of word line patterns 74a and a gate pattern 74b. The word line patterns 74a include floating gate electrodes 57f, the first inter-gate insulating layer 64a and control gate electrodes 69c. The gate pattern 74b includes a lo gate electrode 57g, the second inter-gate insulating layer 64b and a dummy gate electrode 69d. Being different from the prior art, over-etching in the gate electrode pattern 57b can be considerably reduced or prevented during etching the first and second inter-gate insulating layer 64a, 64b. This is because of the reduced thickness difference between thickness T3 and thickness T4. That is to say, recess in the gate electrode pattern 57b can be considerably reduced or prevented just after the etching of the first and second inter-gate insulating layer 64a, 64b. Thus, a thickness of the floating gate patterns 57a is not so much greater than or substantially same as a thickness of the gate electrode pattern 57b just after the etching of the first and second inter-gate insulating layer 64a, 64b. Therefore, etch damage and crystalline defect on the substrate 1 can be considerably reduced or prevented after etching the floating gate patterns 57a and gate electrode pattern 57b.

After the second photoresist patterns 71 are removed, spacers 73 are formed on sidewalls of the word line patterns 74a and the gate pattern 74b.

Source/drain regions 75a and 75b are formed by ion implantation into the first active regions and the second active region using the spacers 73, the word line patterns 74a and the gate pattern 74b as implantation masks. Before forming the spacers 73, an LDD (lightly doped drain) region may be formed by ion implantation into the second active region with a dose within approximately $1 \times 10^{12}$ to $1 \times 10^{14}$ ion atoms/cm$^2$. A first inter-layer insulating layer 77 is formed on the resultant structure having the source/drain regions 75a and 75b. A third photoresist pattern 79 is formed on the first inter-layer insulating layer 77. The third photoresist pattern 79 has an opening to define a portion of the dummy gate electrode 69d, as shown in FIG. 9b.

Figure 10A:
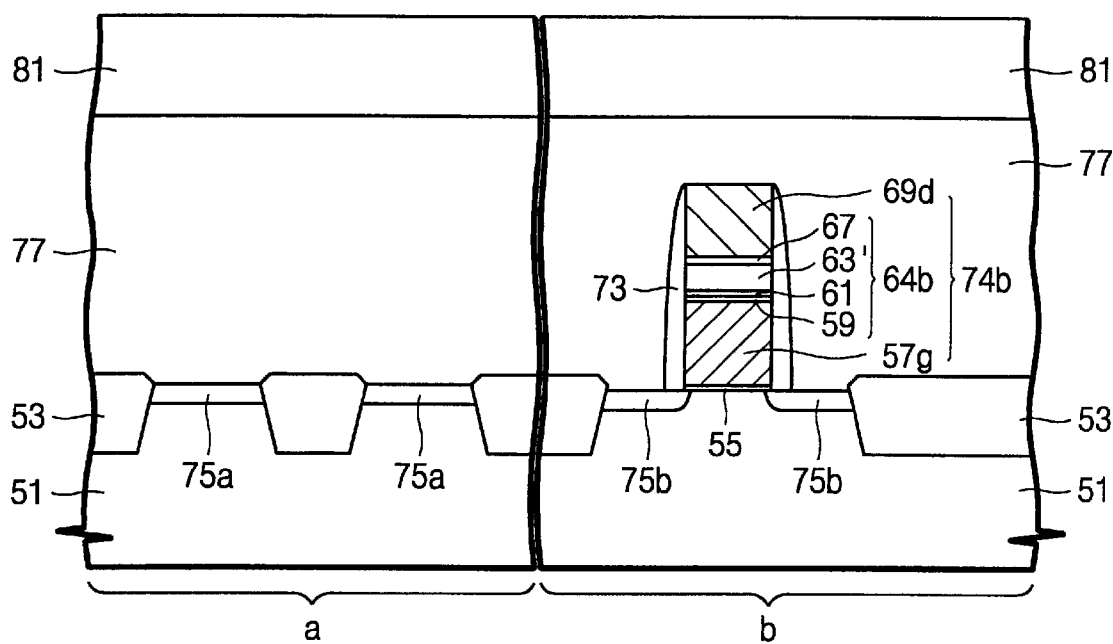
Figure 10B:
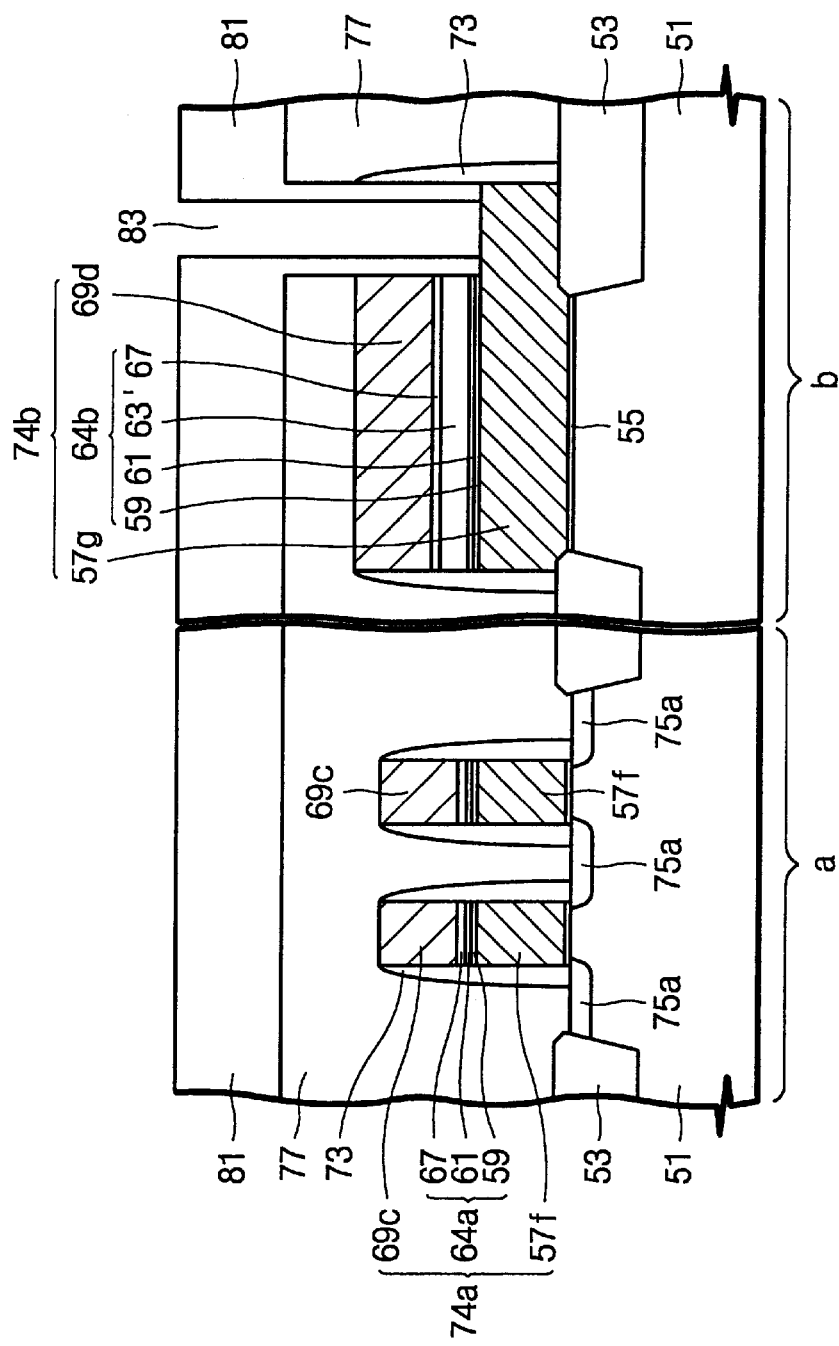

Referring to FIGS. 10a and 10b, the first inter-layer insulating layer 77, the dummy gate electrode 69d and the second inter-gate insulating layer 64b are etched using the third photoresist pattern 79 as a etch mask to expose a portion of the gate electrode pattern 57g. After the third photoresist pattern 79 is removed, a second interlayer insulating layer 81 is formed on the resultant structure. The second inter-layer insulating layer 81 and first inter-layer insulating layer 77 are etched to form a contact hole 83 shown in FIG. 10b to expose the portion of the gate electrode pattern 57g.

Another contact hole may be formed to expose a portion of the control gate electrodes 69c.

According to the present invention, the difference between the thickness of the first inter-gate insulating layer on the sidewalls of the floating gate patterns and the thickness of the second inter-gate insulating layer on the gate electrode pattern can be considerably reduced. Therefore, any etching damage to the substrate in the peripheral circuit area is considerably reduced or prevented altogether.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A non-volatile memory device comprising:
   first and second active regions formed in a semiconductor substrate and defined by an isolation region;
   a control gate electrode disposed across the first active region;
   a floating gate electrode intervening between the control gate electrode and the first active region;
   a first inter-gate insulating layer intervening between the control gate electrode and the floating gate electrode;
   a gate electrode being across the second active region;
   a dummy gate electrode on the gate electrode;
   a second inter-gate insulating layer intervening between the gate electrode and the dummy gate electrode, wherein the second inter-gate insulating layer is thicker than the first inter-gate insulating layer;
   an inter-layer insulating layer formed on the gate electrode; and
   a contact hole formed through the inter-layer insulating layer, wherein the contact hole exposes a portion of the gate electrode.

2. The non-volatile memory device of claim 1, wherein the first inter-gate insulating layer comprises a lower insulating layer, an intermediate insulating layer and an upper insulating layer, which are stacked vertically.

3. The non-volatile memory device of claim 2, wherein the second inter-gate insulating layer comprises the lower insulating layer, the intermediate insulating layer, an additional insulating layer and the upper insulating layer, which are stacked vertically.

4. The non-volatile memory device of claim 3, wherein the lower insulating layer is an oxide material formed by a process selected from a group consisting of thermal oxidation and CVD.

5. The non-volatile memory device of claim 3, wherein the intermediate insulating layer is formed of a silicon nitride material.

6. The non-volatile memory device of claim 3, wherein the additional insulating layer is formed of an oxide material formed by a CVD.

7. The non-volatile memory device of claim 3, wherein the upper insulating layer is an oxide material formed by a CVD process.

8. The non-volatile memory device of claim 3, wherein the additional insulating layer has a relatively fast etch rate while the intermediate insulating layer has a relatively slow etch rate for a given etching process.

9. The non-volatile memory device of claim 1, wherein a sidewall of the floating gate electrode has an inclination to the substrate.

10. A semiconductor device comprising:
    a dense area and a sparse area in a semiconductor substrate, wherein the pattern density of the dense area is higher than the pattern density of the sparse area;
    a first active region formed in the dense area;
    a second active region formed in the sparse area;
    a first conductive layer on the first and the second active regions;
    a second conductive layer on the first conductive layer;
    a silicon nitride layer intervening between the first conductive layer and the second conductive layer; and
    a composite insulating layer intervening between the second conductive layer and the silicon nitride layer and formed on the first and the second active regions, wherein a portion of the composite insulating layer on the second active region is thicker than another portion of the composite insulating layer on the first active region.

11. The semiconductor device of claim 10 which further comprises a lower insulating layer intervening between the first conductive layer and the silicon nitride layer, wherein the lower insulating layer includes an oxide material.

12. The semiconductor device of claim 10, wherein the composite insulating layer comprises an oxide material formed by a CVD process.

13. The semiconductor device of claim 10, wherein the composite insulating layer comprises a material having a relatively fast etch rate while the silicon nitride layer comprises a material having a relatively slow etch rate for a given etching process.

14. The semiconductor device of claim 10, wherein the sparse area is a peripheral circuit area and the dense area is a cell array area.

15. The non-volatile memory device of claim 10, wherein a sidewall of the first conductive layer has an inclination to the substrate.

16. A non-volatile memory device comprising:
    first and second active regions formed in a semiconductor substrate and defined by an isolation region;
    a control gate electrode disposed across the first active region;
    a floating gate electrode intervening between the control gate electrode and the first active region;
    a first inter-gate insulating layer intervening between the control gate electrode and the floating gate electrode;
    a gate electrode being across the second active region;
    a dummy gate electrode on the gate electrode; and
    a silicon nitride layer intervening between the gate electrode and the dummy gate electrode and between the control gate electrode and floating gate electrode; and
    a composite insulating layer intervening between the dummy gate electrode and the silicon nitride layer and between the control gate electrode and the silicon nitride layer, wherein a portion of the composite insulating layer between the dummy gate electrode and the silicon nitride layer is thicker than another portion of the composite insulating layer between the control gate electrode and the silicon nitride layer.

17. The non-volatile memory device of claim 16, further comprises: an inter-layer insulating layer formed on the gate electrode; and
    a contact hole formed through the inter-layer insulating layer, wherein the contact hole exposes a portion of the gate electrode.

18. The non-volatile memory device of claim 16, wherein the substrate comprises a cell array area and a peripheral circuit area, wherein the first active region is formed in the cell array area, and wherein the second active region is formed in the peripheral circuit area.

* * * * *